(12) United States Patent
Tomioka

(10) Patent No.: US 7,683,394 B2
(45) Date of Patent: Mar. 23, 2010

(54) OPTICAL SEMICONDUCTOR DEVICE AND METHOD FOR MANUFACTURING OPTICAL SEMICONDUCTOR DEVICE

(75) Inventor: Taizo Tomioka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 75 days.

(21) Appl. No.: 11/854,280

(22) Filed: Sep. 12, 2007

(65) Prior Publication Data
US 2008/0210964 A1 Sep. 4, 2008

(30) Foreign Application Priority Data
Sep. 22, 2006 (JP) ............................ P2006-257740

(51) Int. Cl.
*H01L 29/227* (2006.01)
*H01L 29/207* (2006.01)
(52) U.S. Cl. ............................ 257/98; 257/99; 257/100
(58) Field of Classification Search ........... 257/98–100; 438/26–29
See application file for complete search history.

(56) References Cited
U.S. PATENT DOCUMENTS 6,274,890 B1 * 8/2001 Oshio et al. ................. 257/98
6,593,598 B2 * 7/2003 Ishinaga ..................... 257/98
6,707,069 B2 3/2004 Song et al.
6,874,910 B2 * 4/2005 Sugimoto et al. ........... 362/294
6,982,522 B2 1/2006 Omoto
7,053,414 B2 * 5/2006 Su et al. ..................... 257/81
2007/0001187 A1 * 1/2007 Kim ............................ 257/98
2007/0095565 A1 * 5/2007 Nagai et al. ................. 174/262

FOREIGN PATENT DOCUMENTS

CN 1497742 A 5/2004
JP 2005-311136 11/2005
KR 10-0439402 7/2003

* cited by examiner

*Primary Examiner*—Kiesha R Bryant
*Assistant Examiner*—Ali Naraghi
(74) *Attorney, Agent, or Firm*—Oblon, Spivak, McClelland, Maier & Neustadt, L.L.P.

(57) ABSTRACT

An optical semiconductor device includes: a base substrate which has a concave portion; a light-emitting element which is provided in the concave portion, and which emits light; a prevention member which is provided to the base substrate in a manner of covering a side surface of the concave portion, and which prevents the light emitted by the light-emitting element from being incident on the side surface of the concave portion; and a translucent member which is provided in the concave portion, and which seals the light-emitting element.

2 Claims, 3 Drawing Sheets

OPTICAL SEMICONDUCTOR DEVICE AND METHOD FOR MANUFACTURING OPTICAL SEMICONDUCTOR DEVICE

CROSS REFERENCE OF THE RELATED APPLICATION

This application is based on and claims the benefit of priority from the prior Japanese Patent Application No. 2006-257740, filed on Sep. 22, 2006; the entire content of which are incorporated herein by reference.

BACKGROUND OF THE INVENTION

1. Field of the Invention

The present invention relates to an optical semiconductor device having a light-emitting element and a method for manufacturing the optical semiconductor device.

2. Description of the Related Art

Optical semiconductor devices are used widely as light sources of various device, such as lighting and a display device, in different areas. As the optical semiconductor devices, proposed is an optical semiconductor device which produces white light and the like by combining light emitted by a light-emitting element and light emitted by a phosphor which is excited by the light emitted by a light-emitting element (refer to JP-A No. 2005-311136 (KOKAI), for example).

Such an optical semiconductor device includes a light-emitting element, such as a light-emitting diode (LED), and a base substrate which has a cup-shaped concave portion housing the light-emitting element. The concave portion is provided with a translucent member which seals the light-emitting element. Incidentally, the base substrate is molded by mold resin. In addition, the translucent member is formed of a translucent resin material mixed with a particulate phosphor.

In such an optical semiconductor device, a part of light emitted from the light-emitting element passes through the translucent member, and is then released. Another part is reflected by a side (a side wall) of the concave portion and is then released. Here, the light incident upon the side surface of the concave portion is reflected or absorbed by the base substrate. Incidentally, the reflectance of light depends on the wavelength of incident light, and generally, the shorter the wavelength is, the lower the reflectance is.

Here, a reflective filler such as titanium dioxide (TiO2) is mixed in mold resin of the base substrate in order to improve the reflectance. The reflectance in an ultraviolet region is less than 10% in this case. To improve the reflectance in the ultraviolet region as well, proposed is an optical semiconductor device in which a part of the resin of the base substrate, that is, only the side surface of the concave portion, is plated with silver. Furthermore, a ceramic substrate which is hardly degraded by light is used as the base substrate in order to prevent the base substrate from being deteriorated by light. In this case, the heat dissipation of the light-emitting element is taken into consideration, and the base substrate made of aluminum nitride is thus used as the ceramic base substrate.

However, the partial plating of the resin of the base substrate with silver increases the cost, because the plating requires a complicated manufacturing step such as masking. Moreover, when the ceramic base substrate made of aluminum nitride or the like is used, the cost increases because the ceramic substrate is expensive.

In addition, if the light energy of the light-emitting element increases in accordance with an improvement in the luminous efficiency of the light-emitting element, an increase in driving current and the like, the base substrate is more likely to degraded by light. Since the reflectance of light further decreases due to the degradation of the base substrate by light, the amount of light extracted and the brightness decrease.

SUMMARY OF THE INVENTION

An object of the present invention is to provide an optical semiconductor device which can prevent a decrease in brightness due to the degradation of a base substrate by light while suppressing the cost, and a method for manufacturing the optical semiconductor device.

A first aspect according to embodiments of the present invention is to include, in the optical semiconductor device: a base substrate which has a concave portion; a light-emitting element which is provided in the concave portion, and which emits light; a prevention member which is provided to the base substrate in a manner of covering a side surface of the concave portion, and which prevents light emitted by the light-emitting element from being incident upon the side surface of the concave portion; and a translucent member which is provided in the concave portion, and which seals the light-emitting element.

A second aspect of the embodiments of the present invention is to include, in a method for manufacturing the optical semiconductor device, forming a prevention member which prevents light from being incident upon the side surface of the concave portion of the base substrate; forming the base substrate by positioning the formed prevention member in a manner of covering the side surface of the concave portion; providing the light-emitting element, which emits light, inside the concave portion of the formed base substrate; and sealing the inside of the concave portion, where the light-emitting element has been provided, by use of the translucent member.

DESCRIPTION OF THE PREFERRED EMBODIMENTS

First Embodiment

Descriptions of a first embodiment of the present invention will be given with reference to FIGS. 1 to 7.

Figure 1:
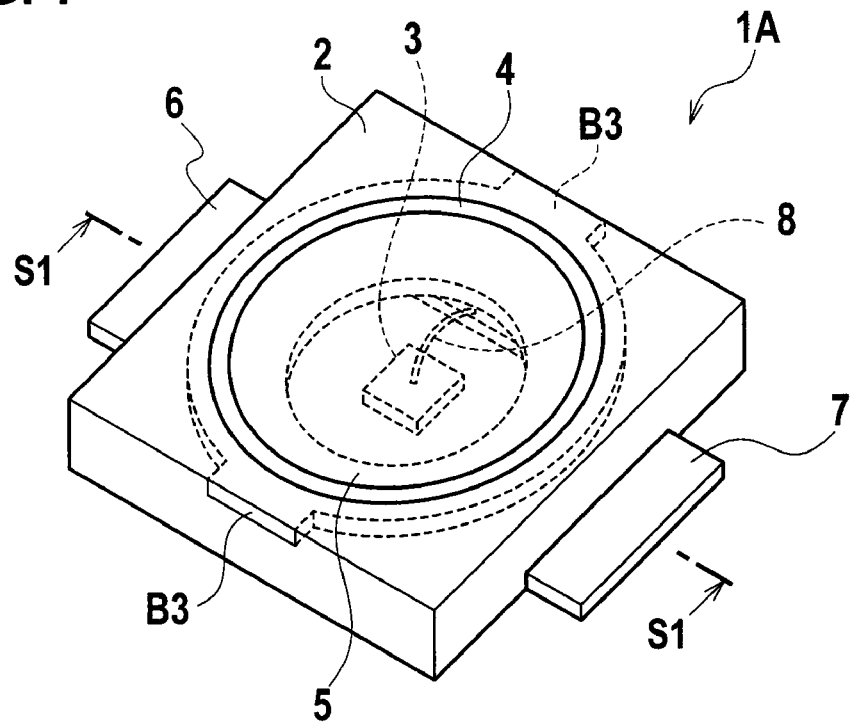
FIG. 1 is a perspective view which shows a schematic configuration of an optical semiconductor device according to a first embodiment of the present invention.
Figure 2:
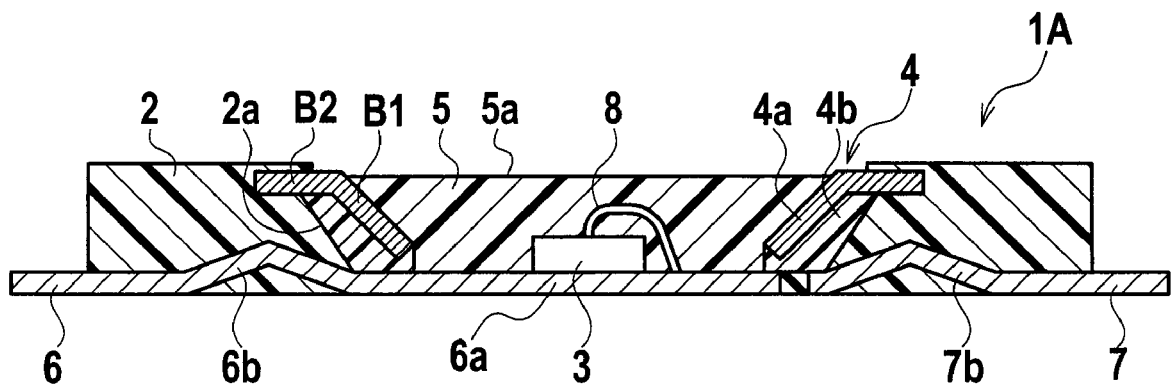
FIG. 2 is a sectional view taken along the S1-S1 line in FIG. 1.

As shown in FIGS. 1 and 2, an optical semiconductor device 1A according to the first embodiment of the present invention includes a base substrate 2, a lighting-emitting element 3, a prevention member 4, a translucent member 5 and a pair of lead parts 6 and 7. The base substrate 2 has a concave portion 2a. The light-emitting element 3 is provided in the concave portion 2a and emits light. The prevention member 4 is provided to the base substrate 2 in a manner of covering a side (a side wall) of the concave portion 2a, and prevents light emitted by the light-emitting element 3 from being incident upon the side surface of the concave portion 2a. The translucent member 5 is provided in the concave portion 2a and seals the light-emitting element 3. The respective lead parts 6 and 7 are connected to the light-emitting element 3, and are extended from the bottom to the outside of the concave portion 2a.

The base substrate 2 has the concave portion 2a which is positioned and provided approximately in the center thereof. The concave portion 2a is shaped into, for example, a cup shape, that is, an inverted truncated cone shape, and is a storage part which houses the light-emitting element 3 therein. The side surface of the concave portion 2a slants in a manner that the concave portion 2a becomes wider toward the outside from the bottom. This type of base substrate 2 is formed of white mold resin, for example. Thermoplastic resin such as polyamide resin is used as mold resin.

The light-emitting element 3 is positioned approximately in the center of the bottom of the concave portion 2a and is mounted on the lead part 6. A bottom electrode (at the bottom surface in FIG. 2) of the light-emitting element 3 is connected to the lead part 6 by a joining member (not illustrated) such as silver paste, thus being connected electrically. In addition, a surface electrode (at the top surface in FIG. 2) of the light-emitting element 3 is electrically connected to the lead part 7 by a connection member 8 such as gold wire. Incidentally, a light-emitting diode (LED) is used as the light-emitting element 3, for example.

The prevention member 4 is configured by: a reflection member 4a which covers the side surface of the concave portion 2a, and which reflects light emitted by the light-emitting element 3; and an insulation member 4b which is adhered to the reflection member 4a, and which has insulation properties.

Figure 3:
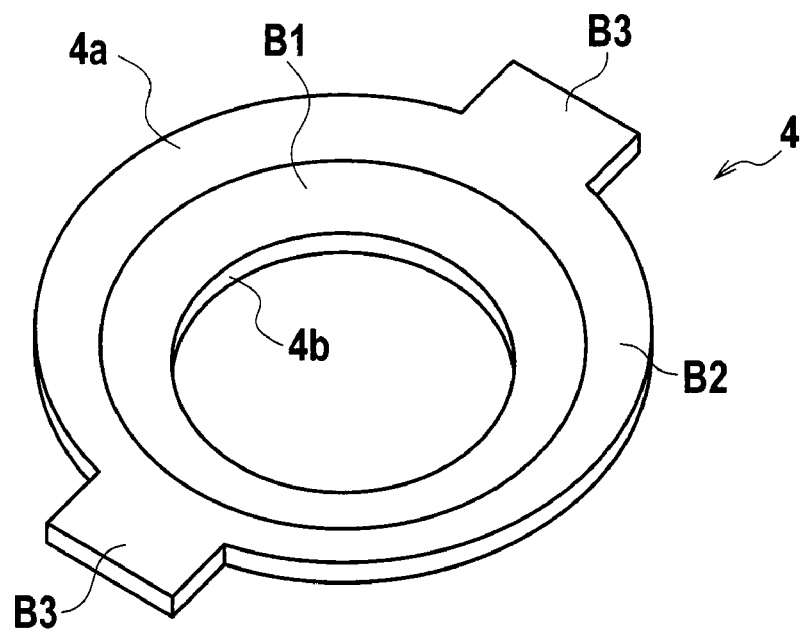
FIG. 3 is a perspective view which shows a schematic configuration of a prevention member included in the optical semiconductor shown in FIGS. 1 and 2.

As shown in FIG. 3, the reflection member 4a is formed into a funnel shape, for example. The reflection member 4a has: a cylinder part B1 which is an inverted truncated cone shape, and is formed into a cylindrical shape; a marginal part B2 which extends from the cylinder part B1; and a pair of extension parts B3 which horizontally extends toward the outside from the marginal part B2, respectively. Here, when the prevention member 4 is provided to the base substrate 2 by forming the pair of extension parts B3 at the reflection member 4a, it is possible to provide the prevention member 4 while embedding the pair of extension parts B3 in the base substrate 2. Consequently, it is possible to improve the bonding power between the prevention member 4 and the base substrate 2.

This type of reflection member 4a is formed of a metal material such as copper. Moreover, the reflection member 4a is formed by stamping a sheet-metal member, for example. The surface of the reflection member 4a is plated with silver, for example. Incidentally, the reflectance of silver in relation to light whose wavelength is 350 nm is much higher than that of white mold resin, and is approximately 80%.

The insulation member 4b is provided to the reflection member 4a in a state where the prevention member 4 is provided to the base substrate 2 such that the insulation member 4b prevents the reflection member 4a of the prevention member 4 from coming into contact with the pair of lead parts 6 and 7 (see FIG. 2). With this, since the reflection member 4a of the prevention member 4 is prevented from coming into contact with the pair of lead parts 6 and 7, it is possible to prevent current from flowing into the reflection member 4a when voltage is applied to the light-emitting element 3.

This type of insulation member 4b is formed of white mold resin, for example. Thermoplastic resin is used as mold resin, for example. Its should be noted that the insulation member 4b and the base substrate 2 may be formed of the same material or different materials.

The translucent member 5 is a member which is provided in the concave portion 2a, and which seals the light-emitting element 3. The translucent member 5 has a release surface 5a for releasing the light emitted by the light-emitting element 3 (refer to FIG. 2). The release surface 5a is an exposed surface contacting with an outside atmosphere, and functions as a light extraction surface which releases the light emitted by the light-emitting element 3.

This type of translucent member 5 is formed of a translucent resin material such as phosphor-mixed resin in which a particulate phosphor is mixed. For example, silicon resin is used as the translucent resin material. Here, the phosphor is a substance which converts the wavelength of the light emitted from the light-emitting element 3, and, for example, emits light having a longer wavelength than that of the light of the light-emitting element 3. As the phosphor, a phosphor releasing yellow light is used, or both of a phosphor releasing yellow light and a phosphor releasing red light are used, for example, when the light-emitting element 3 which releases blue light is used.

Figure 4:
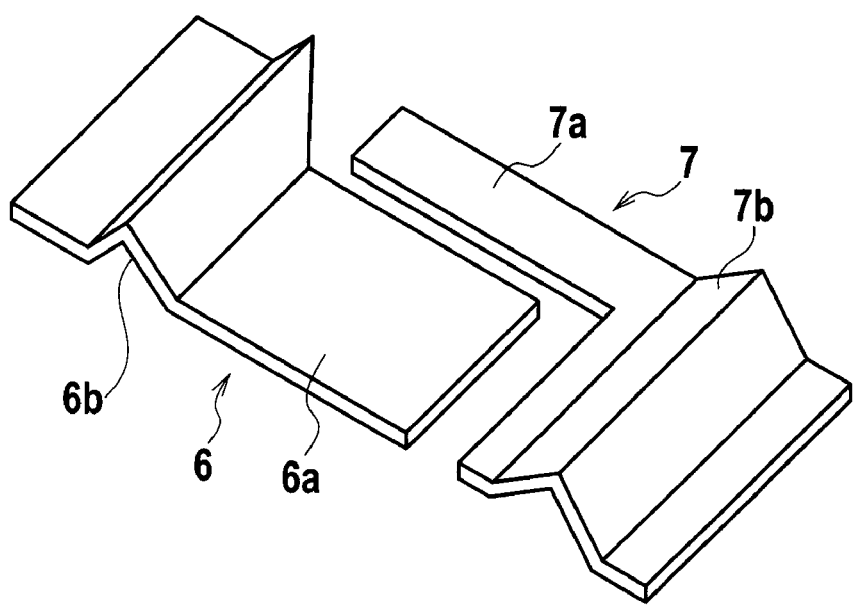
FIG. 4 is a perspective view which shows a schematic configuration of a pair of lead parts included in the optical semiconductor device shown in FIGS. 1 and 2.

The pair of lead parts 6 and 7 are lead frames for supplying power to the light-emitting element 3 from the outside. As shown in FIG. 4, the lead part 6 has: a flat part 6a on which the light-emitting element 3 is mounted; and a bended part 6b which is bent into a gabled form while communicating with the flat part 6a. Furthermore, the lead part 7 has a flat part 7a which is joined to the connection member 8 extending from the light-emitting element 3; and a bended part 7b which is bent into a gabled form while communicating with the flat part 7a.

Such a pair of lead parts 6 and 7 is drawn out from the bottom of the concave portion 2a to the outside, individually. The lead parts 6 and 7 are formed of a metal material such as copper. Moreover, the pair of lead parts 6 and 7 is plated with silver on the surfaces thereof.

Here, when the base substrate 2 is molded by using a mold, mold resin for forming the base substrate 2 flows into spaces between: the flat of the mold on which each of the lead parts 6 and 7 is mounted; and each of the bended parts 6b and 7b of the lead parts 6 and 7. This results in having each of the bended parts 6b and 7b surrounded by the base substrate 2. Consequently, it is possible to improve the bonding power between each of the lead parts 6 and 7 and the base substrate 2.

Next, descriptions of light-emission behavior of such an optical semiconductor device 1A.

If voltage is applied to the pair of lead parts 6 and 7, and power is supplied to the light-emitting element 3, the light-emitting element 3 emits light. A part of the light passes through the translucent member 5, and is released from the release surface 5a as it is. Another part of the light is reflected by the reflection member 4a of the prevention member 4, and is released. In addition, a part of the light flows into the phosphor included in the translucent member 5. Hence, the phosphor is excited and emits light. A part of the light also passes through the translucent member 5, and is released from the release surface 5a. Another part of the light is also reflected by the reflection member 4a of the prevention member 4, and is released from the release surface 5a. In this manner, the light emitted by the light-emitting element 3 and the light emitted by the phosphor excited by the light emitted by the light-emitting element 3 are mixed and released from the release surface 5a of the translucent member 5.

In this type of light-emission behavior, a part of the light emitted by the light-emitting element 3 and the phosphor is reflected by the reflection member 4a of the prevention member 4 toward the release surface 5a of the translucent member 5. Hence, light is prevented from being incident upon the base substrate 2. Consequently, it is possible to prevent the base substrate 2 from being deteriorated by light, and thus to prevent a decrease in brightness due to the degradation of the base substrate 2 by light.

Next, descriptions of the steps of manufacturing the optical semiconductor device 1A will be given.

Figure 5:
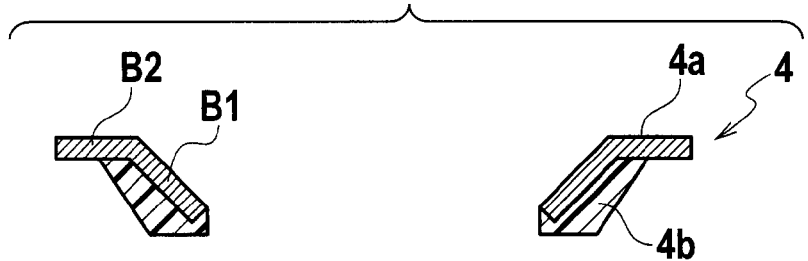
FIG. 5 is a sectional view of a first step which describes a method for manufacturing the optical semiconductor device shown in FIGS. 1 and 2.
Figure 6:
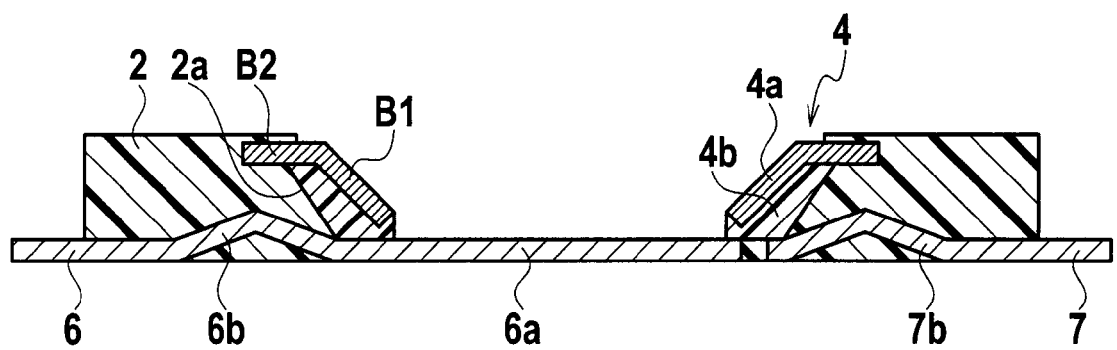
FIG. 6 is a sectional view of a second step.
Figure 7:
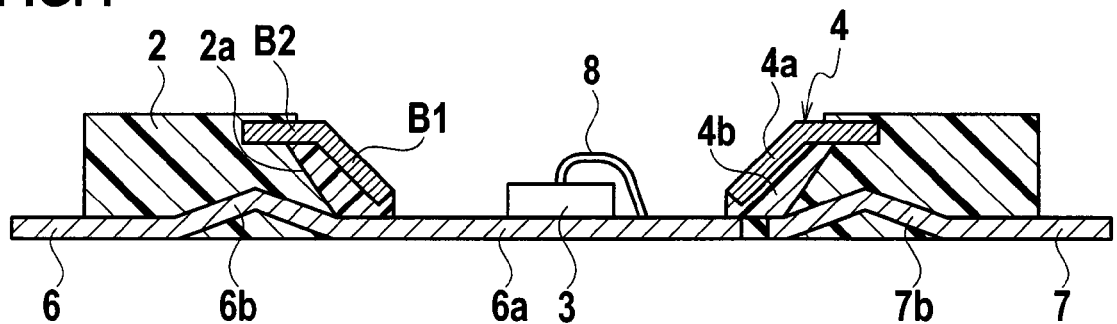
FIG. 7 is a sectional view of a third step.
Figure 8:
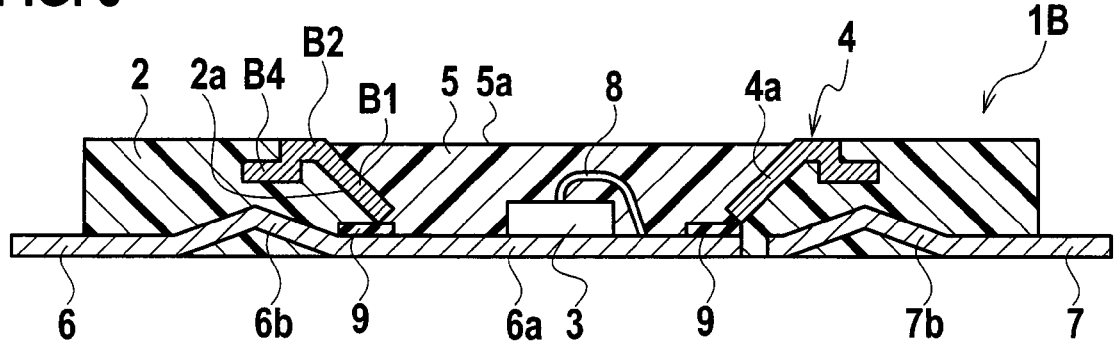
FIG. 8 is a sectional view which shows a schematic configuration of an optical semiconductor device according to a second embodiment of the present invention.

In the steps of manufacturing the optical semiconductor device 1A: the prevention member 4 is formed as shown in FIG. 5; the formed prevention member 4 is positioned in a manner of covering the side surface of the concave portion 2a, and the base substrate 2 is formed, as shown in FIG. 6; the light-emitting element 3 is provided in the concave portion 2a of the formed base substrate 2 as shown in FIG. 7; and the inside of the concave portion 2a, where the light-emitting element 3 is provided, is sealed with the translucent member 5 as shown in FIG. 8.

Specifically, the reflection member 4a is formed out of a sheet-metal member by stamping, as shown in FIG. 5, firstly. Afterwards, the reflection member 4a is attached to a mold for molding the insulation member 4b, and the insulation member 4b is then adhered to the reflection member 4a while being formed of white mold resin by use of the injection molding method, for example. Thus, the prevention member 4 is completed.

Next, as shown in FIG. 6, the pair of lead parts 6 and 7 and the prevention member 4 are attached to a mold for arranging the prevention member 4 in a predetermined position on the pair of lead parts 6 and 7, and for molding the base substrate 2. Then, the base substrate 2 having the concave portion 2a is molded with white mold resin by use of the injection molding method, for example. Thus, the base substrate 2 is completed. At this point, the white mold resin flows into spaces between: the flat of the mold on which each of the lead parts 6 and 7 is mounted; and each of the bended parts 6b and 7b of the lead parts 6 and 7. As a result, each of the bended parts 6b and 7b is to be surrounded by the base substrate 2.

Afterwards, as shown in FIG. 7, a joining member such as silver paste is applied to the surface of the flat part 6a of the lead part 6 positioned at the bottom of the concave portion 2a. The light-emitting element 3 is mounted on the surface, and is joined to the lead part 6. Then, the connection member 8 such as a gold wire electrically connects the top-surface electrode of the light-emitting element 3 to the flat 7a of the lead part 7. As a result, the light-emitting element 3 is provided in the concave portion 2a of the base substrate 2.

Lastly, silicon resin is filled in the concave portion 2a of the base substrate 2 to seal the light-emitting element 3. This provides the translucent member 5 made of silicon resin in the concave portion 2a of the base substrate 2, and consequently, the optical semiconductor device 1A is completed as shown in FIG. 2.

Here, as the pair of lead parts 6 and 7, used are, for example, lead parts with the thickness of 200 µm, the surfaces of which silver being plated with the thickness of 2 µm. In addition, as the light-emitting element 3, used is a blue light-emitting diode whose size is 900×900×200 µm³, for example. Moreover, as the phosphor, used is a yellow phosphor which converts blue light into yellow light, for example. Furthermore, the degree of bend of the reflection member 4a of the prevention member 4 is 450, and the diameter of the opening portion on the side of the light-emitting element 3 is 0.3 mm.

As described above, according to the first embodiment of the present invention, by providing the base substrate 2 with the prevention member 4 which prevents the light emitted from the light-emitting element 3 being incident upon the side surface of the concave portion 2a while the prevention member 4 covers the side surface of the concave portion 2a, the light emitted from the light-emitting element 3 is prevented from being incident upon the base substrate 2, and the degradation of the base substrate 2 by light is prevented, without partially plating the concave portion 2a of the base substrate 2 with silver, and without using a ceramic substrate such as aluminum nitride. Thus, it is possible to prevent a decrease in brightness due to the degradation of the base substrate 2 by light while suppressing the cost. As a result, it is possible to keep high brightness for a long time at low cost.

In addition, the prevention member 4 reflects the light emitted by the light-emitting element 3 so that the efficiency of taking out light from the release surface 5a of the translucent member 5 increases. Hence, it is possible to increase the brightness of the light-emitting element 3.

Furthermore, a part of the prevention member 4 is embedded in the base substrate 2 so that the bonding power between the prevention member 4 and the base substrate 2 increases. Thus, the prevention member 4 is prevented from coming off the base substrate 2. Hence, it is possible to improve reliability in the parts of the optical semiconductor device 1A.

Second Embodiment

Descriptions of a second embodiment of the present invention will be given with reference to FIG. 8. In the second embodiment of the present invention, descriptions will be given of the parts which are different from the first embodiment. It should be noted that, in the second embodiment, the same symbols are attached to the same parts as those described in the first embodiment, and the descriptions thereof will be omitted.

As shown in FIG. 8, the prevention member 4 is configured of the reflection member 4a in an optical semiconductor device 1B according to the second embodiment of the present invention. Moreover, an insulation layer 9 having insulation properties is provided on the pair of lead parts 6 and 7. In addition, the marginal part B2 is provided with a step part B4.

The insulation layer 9 is provided in a position facing the reflection member 4a. In other words, the insulation layer 9 is provided in a circular form on the pair of lead parts 6 and 7 while facing the end part, on the side of the light-emitting element 3, of the reflection member 4a. With this, the reflection member 4a is prevented from coming into contact with the pair of lead parts 6 and 7 while in a state where the reflection member 4a is provided to the base substrate 2. Hence, it is possible to prevent current from passing through the reflection member 4a when voltage is applied to the light-emitting element 3.

The step part B4 is formed into a toric shape by bending the marginal part B2 in the direction of the bottom of the concave portion 2a. With this, when the reflection member 4a is provided to the base substrate 2, the reflection member 4a can be provided while the step part B4 is embedded in the base substrate 2. As a result, it is possible to improve the bonding power between the reflection member 4a and the base substrate 2.

As described above, according to the second embodiment of the present invention, it is possible to obtain the same effects as those obtained according to the first embodiment. Moreover, by configuring the prevention member 4 with the reflection member 4a alone, it is possible to simplify the manufacture of the prevention member 4. In addition, since the step part B4 is embedded in the base substrate 2, it is possible to further strengthen the bonding power between the reflection member 4a and the base substrate 2.

Other Embodiment

Incidentally, the present invention is not limited to the above-mentioned embodiments, and various alterations can be made therein in a scope where spirits thereof are not departed from the sprit of the present invention.

For example, although various numerical values are cited in the above-mentioned embodiments, these numerical values are examples, and do not limit the present invention.

What is claimed is:

1. An optical semiconductor device comprising:
   a base substrate which has a concave portion;
   a light-emitting element which is provided in the concave portion, and which emits light;
   a pair of lead parts which is provided to the base substrate, and which include lead frames for supplying power to the light-emitting element;
   a prevention member which is provided to the base substrate in a manner of being separated from the pair of lead parts and covering a whole side surface of the concave portion, and which prevents the light emitted by the light-emitting element from being incident upon the whole side surface of the concave portion; and
   a translucent member which is provided in the concave portion, and which seals the light-emitting element;
   wherein the prevention member includes:
      a cylinder part which has an inverted truncated cone shape, and is formed into a cylindrical shape; and
      a marginal part which horizontally extends from the cylinder part, wherein a part of the marginal part is embedded in the base substrate;
   wherein the marginal part includes a step part which is formed into a toric shape by bending the marginal part, and the step part is embedded in the base substrate.

2. A method for manufacturing an optical semiconductor device comprising:
   forming a prevention member;
   forming a pair of lead parts;
   forming a base substrate which has a concave portion, on the pair of lead parts, while positioning the formed prevention member in a manner of being separated from the pair of lead parts and covering a whole side surface of the concave portion;
   providing a light-emitting element which emits light, in the concave portion of the formed base substrate, and electrically connecting the light-emitting element to the pair of lead parts; and
   sealing the inside of the concave portion in which the light-emitting element is provided, with a translucent member,
   wherein the prevention member includes:
      a cylinder part which has an inverted truncated cone shape, and is formed into a cylindrical shape,
      a marginal part which horizontally extends from the cylinder part, and
      the base substrate is formed such that a part of the marginal part is embedded in the base substrate,
   wherein the marginal part includes a step part which is formed into a toric shape by bending the marginal part, and
   the base substrate is formed such that the step part is embedded in the base substrate.

* * * * *